(12) United States Patent
Desset et al.

(10) Patent No.: US 7,885,326 B2
(45) Date of Patent: Feb. 8, 2011

(54) METHOD FOR DETERMINING A PULSE POSITION IN A SIGNAL

(75) Inventors: Claude Desset, Hoegaarden (BE); Mustafa Badaroglu, Leuven (BE)

(73) Assignee: IMEC, Leuven (BE)

( * ) Notice: Subject to any disclaimer, the term of this patent is extended or adjusted under 35 U.S.C. 154(b) by 743 days.

(21) Appl. No.: 11/824,152

(22) Filed: Jun. 29, 2007

(65) Prior Publication Data
US 2008/0025386 A1    Jan. 31, 2008

(30) Foreign Application Priority Data
Jun. 30, 2006 (EP) .................. 06116447

(51) Int. Cl.
*H03K 7/04* (2006.01)
(52) U.S. Cl. ..................................... 375/239
(58) Field of Classification Search ................. 329/313; 370/205; 375/130, 239
See application file for complete search history.

(56) References Cited

U.S. PATENT DOCUMENTS

| | | | | |
|---|---|---|---|---|
| 5,809,020 | A * | 9/1998 | Bruckert et al. | 370/335 |
| 5,949,817 | A * | 9/1999 | Marshall | 375/142 |
| 6,611,512 | B1 | 8/2003 | Burns | |
| 2004/0136439 | A1* | 7/2004 | Dewberry et al. | 375/130 |

FOREIGN PATENT DOCUMENTS

WO    WO-96/41432 A1 *  7/1996
WO    9641432 A1    12/1996

OTHER PUBLICATIONS

Claude Desset. "UWB Search Strategies for Minimal-Length Preamble and a Low-Complexity Analog Receiver".
Julien Ryckaert et al., "A 16mA UWB 3-to-5GHz 20Mpulses/s Quadrature Analog Correlation Receiver in 0.18micro-m CMOS," ISSCC 2006 / Session 6 / UWB Transceivers / 6.1.
European Search Report in Application No. 07110972.2 (Mailed Oct. 30, 2007).
Aedudodla et al., "Timing acquisition in ultra-wideband communication systems", IEEE Transactions on Vehicular Technology, 54(5):1570-1583, Sep. 2005.

(Continued)

*Primary Examiner*—David C Payne
*Assistant Examiner*—Leon-Viet Q Nguyen
(74) *Attorney, Agent, or Firm*—McDonnell Boehnen Hulbert & Berghoff LLP (57) ABSTRACT

A method is presented for determining an actual pulse position in a signal. This signal comprises a plurality of successive frames, wherein each frame has length L and contains one pulse with width W, a number of discrete possible pulse positions being considered within in each frame which is at least L/W. The method comprises the steps of a) sampling the signal at a sampling rate below L/W with a varying sampling phase such that the whole frame length L is covered, b) obtaining a set of samples with at least one at each of the possible pulse positions, c) correlating this set of samples with a set of one or more predetermined values and d) determining the actual pulse position from said correlation. The method provides a low-complex signal acquisition solution in a receiver and is particularly useful for low-complexity and low-power IR-UWB transceivers.

12 Claims, 7 Drawing Sheets

OTHER PUBLICATIONS

Ryckaert, J. et al., "Carrier-based UWB impulse radio: Simplicity, flexibility and pulser implementation in 180nm CMOS", ICU, Zurich, Switzerland, Sep. 2005.

Fort, Andrew, et al. Characterization of the ultra wideband body area propagation channel. In ICU, Zurich, Switzerland, Sep. 2005.

Verhelst, M. et al., "Architectures for low power ultra-wideband radio receivers in the 3.1-5GHz band for data rates < 10Mbps," ISLPED'04, International Symposium on Low Power Electronics and Design, pp. 280-285, Aug. 2004.

Blazquez, R. et al., "A baseband processor for impulse ultra-wideband communications," IEEE Journal on Solid-State Circuits, 40(9):1821-1828, Sep. 2005.

Vijayakumaran, S. et al., "A search strategy for ultra-wideband signal acquisition," IEEE Transactions on Communications, 53(12):2015-2019, Dec. 2005.

Proakis, John G., Digital Communications, Third ed. McGraw-Hill, 1995, Index pp. xi-xix, Chapter 2, pp. 36-51, Chapter 5, pp. 233-245.

Ryckaert, J. et al., "A 16mA UWB 3-to-5GHz 20Mpulses/s Quadrature Analog Correlation Receiver in 0.18um CMOS", 2006 IEEE International Solid-State Circuits Conference, Session 6, UWB Transceivers, 6.1, San Francisco, CA, USA, 10 pages.

* cited by examiner

METHOD FOR DETERMINING A PULSE POSITION IN A SIGNAL

FIELD

The present invention relates to a method for determining a pulse position in a signal. In particular, the invention is useful for low-complexity and low-power IR-UWB transceivers.

BACKGROUND

Ultra-Wideband is a high-potential technique for low-power solutions in short-range wireless communications. It is therefore studied by various standards. In addition, UWB is a viable candidate for wireless body area networks or sensor networks with severe power constraints and where the communication scenario is mostly asymmetric, such as ultra-low-power sensors transmitting to a base station. A device which is particularly suited to such low-power and low to middle-rate applications thanks to low-complexity analog implementations, is e.g. an impulse radio solution (IR-UWB).

Whatever the selected architecture, synchronization is the biggest problem for IR-UWB reception. All positions are searched in order to find the location where pulses are recovered with maximal energy, and pulses must be combined correctly in order to recover data bits. Therefore, before sending the data, the transmitter has to send a preamble long enough to make the synchronization possible.

There are two main approaches for signal acquisition: optimal estimation techniques and threshold-based search strategies, Sandeep R. Aedudodla et al., "Timing acquisition in ultra-wideband communication systems", *IEEE Transactions on Vehicular Technology*, 54(5):1570-1583, September 2005. Receivers relying on optimal estimators often need a full Nyquist-rate digital sampling of the incoming signal, at one Giga sample per second in the baseband as demonstrated in R. Blaquez et al., "A baseband processor for impulse ultra-wideband communications", *IEEE Journal on Solid-State Circuits*, 40(9):1821-1828, September 2005. This makes such solutions more complex in terms of signal processing and puts high constraints on the ADC and its power consumption. Simpler search solutions lead to a lower performance, but at a reduced cost.

SUMMARY

It is an aim of the present disclosure to describe an acquisition algorithm that is well suited for a low-power receiver architecture and has a good acquisition performance. It is further an aim of this disclosure to provide a device for implementing the acquisition algorithm These aims are believed to be achieved with the with the methods and systems claimed in the present application.

The present disclosure describes a method for determining an actual pulse position in a continuous signal. The signal comprises a plurality of successive frames, with length L and which can each contain one pulse with a given pulse width W. A number of discrete possible pulse positions are being considered within each frame which is at least L/W. A method as disclosed herein comprises the following steps. The signal is sampled at a sampling rate below L/W with a varying sampling phase such that the whole frame length L is covered, thereby obtaining a set of samples with at least one at each of the possible pulse positions. Actually, the number of samples taken at a given position over successive frames is the product of two numbers, $N_c$ times $N_b$. $N_c$ denotes the number of pulses that are required to for one bit of information. $N_b$ is used in order to accumulate several bits of information before taking the decision over one position, which is needed given that the synchronization operation has more importance in case of failure than receiving one simple bit of data. The set of samples are correlated with a set of predetermined values. From the correlation, the actual pulse position is determined. The pulse position can be determined by correlating samples taken at pulse repetition rate. Synchronization algorithms of the prior art, on the other hand, search all positions within each frame in order to find the location of the pulses with maximal energy. Therefore a full Nyquist-rate sampling of the incoming signal is used, increasing the power consumption of the communication system.

An efficient search strategy is provided for systems using a low sampling speed receiver. The methods described herein can be used in for example a low sampling speed receiver, being part an impulse-based ultra-wideband system. Another example is that of a sensor network where a central node receives data from ultra-low-power sensors which can only send a few pulses. The method for determining an actual pulse position can be used in any other communication system known to the person skilled in the art that requires low power consumption.

In a preferred embodiment, the set of predetermined values forms a code and each group of a fixed number of successive frames forms a repeated symbol containing said code, the method further comprising the step of: determining a code phase from said correlation which is the offset between said repeated symbol of said signal and the code formed by said set of predetermined values.

In a preferred embodiment, the actual pulse position and the code phase are determined together by parallel correlation of said set of samples with rotated versions of said set of predetermined values. The technique of searching first for the pulse position in frames and afterwards for the spreading code phase at the selected position, suffers from a very poor energy accumulation in the first phase, which as a consequence requires a very long preamble. Above the receiver power, the transmitter consumption is also important. The method described herein allows working with a preamble of limited length, reducing the transmitter power consumption.

In a preferred embodiment, said sampling rate is equal to the pulse repetition frequency of said signal. This means that one sample is taken per frame, the sampling phase being varied for each successive frame until the whole frame length is covered. Alternatively, also two, three or more samples could be taken per frame.

In a preferred embodiment, said method is performed in both an I-branch and a Q-branch of a receiver, when the receiver uses binary phase-shift keying (BPSK).

In a preferred embodiment, said method is performed on a common branch of a receiver when the receiver uses pulse position modulation (PPM), recombining I and Q energy.

In another aspect, a device for carrying out the above acquisition algorithm is proposed. The device comprises a serial-to-parallel converter, a correlator and a selector. The serial-to-parallel converter converts the set of samples from serial data to parallel data. The correlator correlates the set of samples with the set of predetermined values, thereby obtaining a set of correlation values. The selector for selects a maximum among the set of correlation values, wherein the maximum defines the actual pulse position. Such device can be part of the receiver block in a communication system, consuming low power.

In a preferred embodiment, the correlator is a sliding correlator which is provided for rotating the set of predetermined values during the correlation and computing all the rotated correlations with a throughput of one per each clock cycle and incoming decision variable. The clock cycle is the time duration, equal to the frame duration. In other words, at a frequency equal to the pulse repetition frequency, a set of correlations is calculated. The incoming decision variable is what comes out of the pre-processing stage in the digital chip, acting on the ADC samples received from the analog chip. For BPSK, it means I ADC samples and Q ADC samples, processed in parallel (so two correlator chains are used here). For PPM, it means an energy difference that has been computed between position 1 and 2, based on the four ADC samples received (I1, Q1, I2, Q2), as one single variable. The "decision variable" is the name for this quantity computed differently based on modulation, but processed in the same way. Thereby, the actual pulse position and the code phase can be determined simultaneously through a digital implementation requiring a pipelined correlator architecture. This embodiment takes advantage of the acquisition algorithm as such, including the way it is linked to the whole system (feedback to the analog chip from which it gets information), and its digital implementation requiring a pipelined correlator architecture.

In a preferred embodiment, said device is part of an IR-UWB receiver. Impulse-based Ultra-Wideband systems are appealing for low-power short-range communications as they can benefit from low-complexity analog architectures. This includes a transmitter only consuming power when sending a pulse and an analog receiver sampling only at the pulse repetition frequency. The pipelined digital architecture enables the whole system to be clocked only at the pulse repetition frequency. The algorithm of the present disclosure has a performance within 1.5 dB of perfectly synchronized systems on AWGN, and a low complexity as the exhaustive search can take place on a short preamble.

BRIEF DESCRIPTION OF THE DRAWINGS

Exemplary embodiments of the invention will be elucidated by means of the following description and the appended figures.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The present invention relates to a method for performing signal acquisition and a device for carrying out this acquisition algorithm. The signal acquisition method is in particular interesting for communication systems requiring low power consumption.

Figure 1:
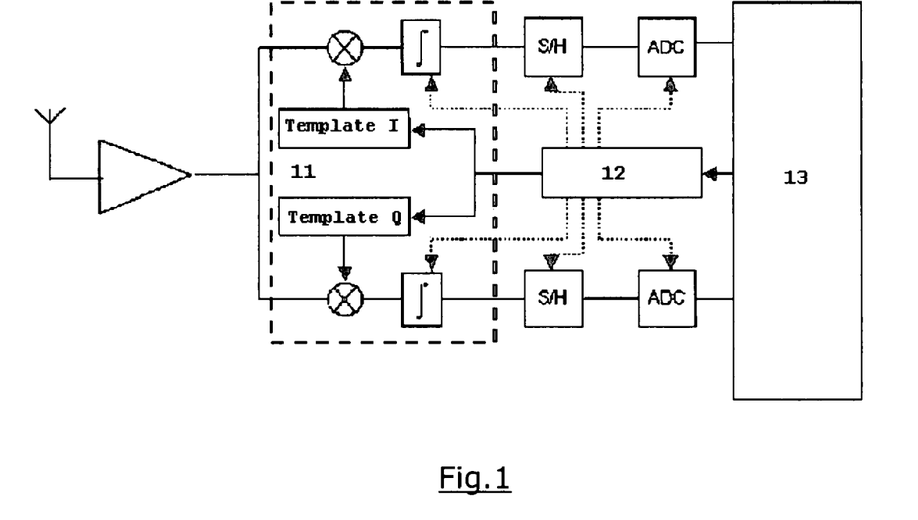
FIG. 1 shows an analog-based receiver architecture.

A preferred embodiment of the invention uses an impulse-based ultra-wideband system (IR-UWB), and this preferred embodiment is described herein. In particular, an UWB system is used comprising an UWB transmitter and receiver system. The transmitter is demonstrated in J. Ryckaert et al., "Carrier-based UWB impulse radio: Simplicity, flexibility and pulser implementation in 180 nm CMOS", *ICU*, Zurich, Switzerland, September 2005, which is hereby incorporated by reference in its entirety. The measurements indicate that the pulser consumes only 2 mW burst power for a pulse repetition rate of 40 MHz. Low-power receivers are more complex to design, but an analog-based solution is also more effective for low-power applications, implementing the matched filtering in analog domain and taking samples only at the pulse repetition rate [1]. Such solutions have recently been implemented at low power, J. Ryckaert et al., "A 16 mA UWB 3-to-5 GHz 20 MPulses/s quadrature analog correlation receiver in 0.18 μm CMOS", ISSCC, San Francisco, Calif., USA, February 2006, which is hereby incorporated by reference in its entirety. FIG. 1 describes an analog receiver, wherein the different elements are being clocked by a timing circuit (12). It considers carrier-based UWB, and works in I/Q baseband after quadrature down-conversion (11). This limits the (analog) baseband processing to a bandwidth of 500 MHz, where the matched filtering operation takes place with a locally generated template. This architecture can work with both coherent BPSK and non-coherent PPM modulations, depending on the digital processing implemented afterwards.

Practically, this system assumes analog pre-processing of the incoming signal, providing matched filtering of the pulses via Template I/Q (11) and integrators of FIG. 1. This pre-processing and sampling of the signal takes place once per frame (a frame being the duration inverse of the average pulse repetition frequency), according to the timing circuit (12). This timing is set thanks to the flexible delay line. Two samples per frame are taken for PPM, as two positions have to be considered.

The signal acquisition block performing the signal acquisition algorithm described herein will be part of the digital receiver baseband block (13). In particular, the signal acquisition block provides two operating modes: 1. synchronization modules responsible for time-domain-based code/timing acquisition and 2. end of preamble detection module. The first module determines at which place(s) of the frames the pulses appear (low-level pulse synchronization) and which pulses are put together to form one bit or symbol (spreading code phase synchronization). The acquisition module searches simultaneous for pulse position and code phase.

A. System Model and Signal Acquisition Steps

Figure 2:
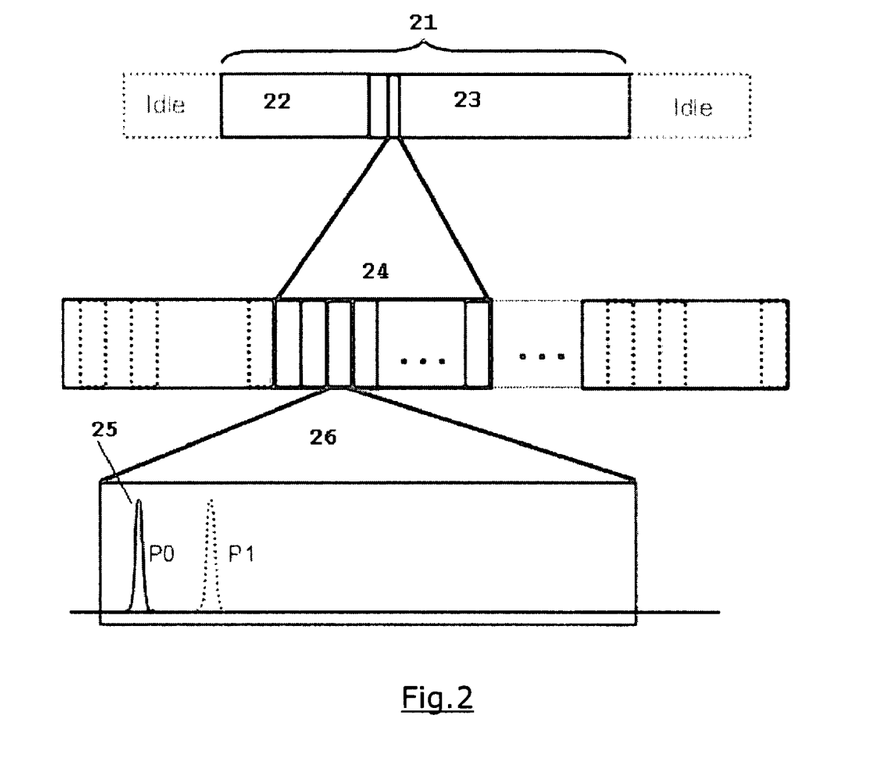
FIG. 2 shows the link between pulses (one per frame), bits, and bursts. The preamble contains a number of repeated identical bits, followed by a special end-of-preamble sequence.

In order to describe the acquisition process, the overall air interface that is considered to transmit a data burst (21) is depicted in FIG. 2. A burst comprises a preamble (22) and a payload (23). One bit (24) is spread over $N_c$ chips. $N_c$ denotes the number of pulses that are required for one bit of information. Each of them is transmitted as a pulse (25), and each pulse occurs somewhere within a frame (26) (one per pulse), the frame being the time unit matching the pulse repetition rate. For the design described herein, each frame (26) nominally lasts 25 ns (40-MHz pulse repetition rate), and contains one triangular pulse of 500-MHz bandwidth, detected by a matched rectangular pulse. Note that the algorithms of the present invention may also be used in other receiver designs. The spreading code is defined by a sequence $\{c_j, 1 \leq j \leq N_c\}$. Depending on the modulation choice, we have two possible system descriptions, (1) for BPSK and (2) for PPM (pulse position modulation):

$$x(t) = \sum_{k=-\infty}^{+\infty} b_{\lfloor k/N_C \rfloor} c_{(k \bmod N_C)} p(t - kT_p) \quad (1)$$

$$x(t) = \sum_{k=-\infty}^{+\infty} p\left(t - kT_p - \frac{1 - b_{\lfloor k/N_C \rfloor} c_{(k \bmod N_C)}}{2} T_{PPM}\right) \quad (2)$$

where $\lfloor x \rfloor$ denotes the integer part, k mod N the remainder of k modulo N, and p(t) is the basic pulse. In our system p(t) relies on carrier-based UWB; all the synchronization and demodulation operations take place after down-conversion of p(t) in I and Q baseband components.

The acquisition has to determine at which place(s) of the frames (26) these pulses (25) appear (low-level pulse synchronization), which pulses are put together to form one bit (24) or symbol (spreading code phase synchronization), and where the data payload (23) effectively starts. The start of data payload is detected thanks to an end-of-preamble (EOP) sequence, while the previous steps are based on repeated preamble symbols.

Two acquisition strategies are possible: either searching first for the pulse position in frames and afterwards for the spreading code phase at the selected position, or doing both simultaneously. In an acquisition method described herein, pulse and code phase synchronization are performed simultaneously. A comparison of both techniques is reproduced in the Appendix below.

Figure 3:
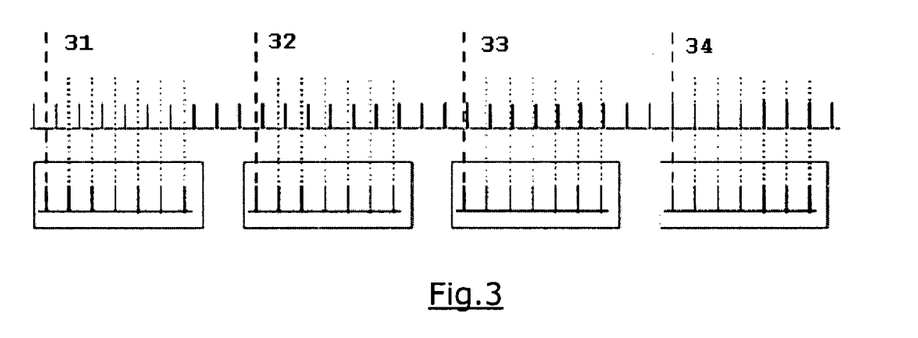
FIG. 3 shows the searching step of the synchronization, scanning N samples at each possible position in the frame.

The receiver searches for pulses by sampling the received signal with a clock whose phase can be varied in a number of delay steps covering the whole frame duration. FIG. 3 illustrates the searching steps of the synchronization algorithm, scanning N samples at each possible position in the frame. Where N equals $N_c \times N_b$ and wherein $N_c$ denotes the number of pulses that are required for one bit of information. $N_b$ is used in order to accumulate several bits of information before taking the decision over one position, which is needed given that the synchronization operation has more importance in case of failure than receiving one simple bit of data. This algorithm is exemplified in FIG. 3, where a first position is at $T_0$ (31), a second at $T_0 + NT_{frame} + T_{step}$ (32), a third at $T_0 + 2NT_{frame} + 2T_{step}$ (33) and a fourth at $T_0 + 3NT_{frame} + 3T_{step}$ (34), covering the whole frame. For each position, all the possible phases of the spreading code are tested, using a pipelined implementation of the spreading code correlator. When the detected signal energy exceeds a threshold, a new scanning pass tests once again each possible position to make sure that the selected position has the highest energy. For a single-tap receiver as considered here, this translates into maximal effective signal-to-noise ratio.

For each position, the code despreading takes place by coherent combination of the incoming pulses. For BPSK, both I and Q inputs are separately despread in two parallel correlators. As the carrier phase is still missing to coherently recombine them, the maximum-energy position is then detected by computing the corresponding energy from I and Q despread values. The phase of the selected maximum is used afterwards as carrier phase estimate for I/Q recombination of data bits. When PPM is used, the energy at both possible positions is first computed within each frame. Afterwards, the result difference between energy at position one and position two is computed. This difference is used as binary soft information for the despreading operation. For both modulations, in order to increase the signal-to-noise ratio in the acquisition process, the number of bits accumulated for one trial or $N_b$ symbols are averaged before taking the decision.

Figure 4:
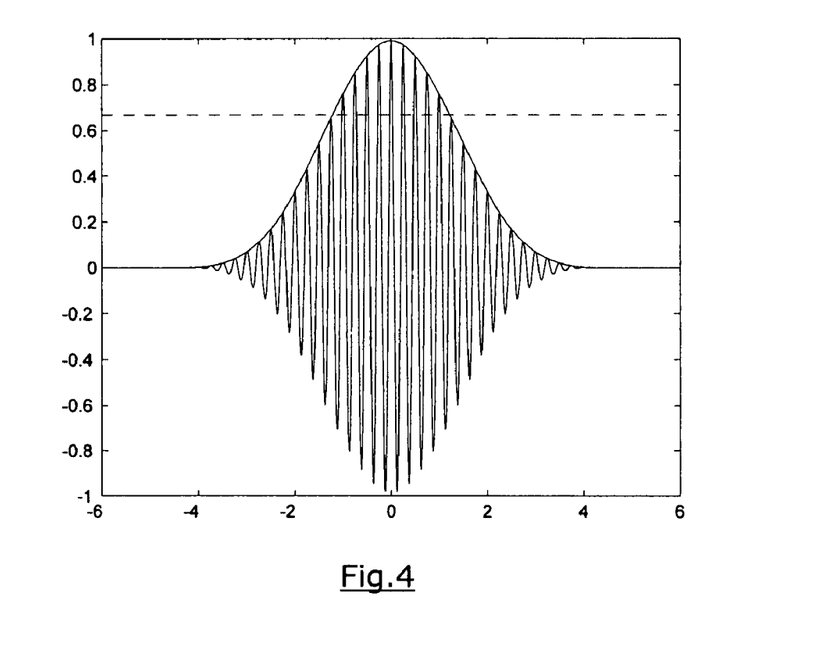
FIG. 4 shows the impact of offset in ns between received pulse and correlator output.

In order to find the position of pulses within the frames, a discrete set of positions or delays is considered, with enough accuracy to make sure that the maximum energy point of received pulses is found while limiting the search duration to the necessary number of positions. In this respect, a delay step of 1 ns is a reasonable trade-off, as shown by FIG. 4. It leads to an error of maximum 0.5 ns from the peak, translating into a loss of 0.5 dB (correlation 0.89). A step of 2 or 3 ns would lose 2 or 5 dB, respectively. For a 40-MHz clock, using 1-ns steps means that 25 pulse positions are checked.

B. Required Preamble and Thresholds

Before searching for the signal, the threshold-based acquisition scheme computes the required threshold distinguishing signal from noise. The noise power is first estimated by averaging its energy over several samples, and the threshold is relatively defined with respect to it. In order to describe it, the relevant parameters are defined in Table 1. They also include preamble definition parameters, related to the number of symbols to consider for each acquisition search.

TABLE 1

Definition of main variables

| | |
|---|---|
| $N_c$ | Number of pulses per bit (given) |
| $SNR_b$ | Signal-to-noise, per bit ($N_c$ pulses, given) |
| SNR | Signal-to-noise, per pulse (function of $SNR_b$) |
| $N_b$ | Number of bits accumulated for one trial (the parameter we want to minimize) |

The receiver gets signal samples from I and Q branches, and in case of PPM also from both positions. Without loss of generality, it can be assumed that the signal is aligned with the I direction, and consider the following inputs:

$$r_I = s_I + n_I \quad (3)$$

$$r_Q = n_Q \quad (4)$$

The noise is assumed to be normalized to a unit variance in each branch, and accordingly the signal as the specified pulse signal-to-noise ratio $SNR = s_I^2$. For PPM, two extra samples containing only noise are received at the other position. Coherent accumulation of $N_c$ received samples by despreading leads to variables $d_I$ and $d_Q$, respectively.

For BPSK, when the phase $\phi$ is known—0 in equations (3) and (4)—the coherent recombination of I/Q as well as spreading code leads to the following decision variable:

$$d_{BPSK} = d_I \cos\phi + d_Q \sin\phi = N_c s_I + n_d, \quad (5)$$

where the signal part has an amplitude $N_c \sqrt{SNR}$ and the noise $n_d$ on the decision has a standard deviation $\sqrt{N_c}$ after accumulation of $N_c$ independent samples as $n_I$ in the direction corresponding to $\phi$. Normalizing by $\sqrt{N_c}$, this leads to the bit signal-to-noise ratio, as $SNR_b$ is defined as $N_c SNR$.

During the acquisition phase, the spreading code is coherently recombined, but the I/Q combination takes place by energy detection. This leads to a decision variable which is $d_I^2 + d_Q^2$. Using the normalization by $N_c$ (not its square root here as we work with signal energies), it has an expected value $SNR_b + 2$ considering both I and Q noise, and a variance which is $2(SNR_b + 1)$, for the non-central Chi-squared distribution variance.

In the case of PPM, the energy combination occurs first from I and Q, followed by the difference between energy at both positions. This leads to a decision variable of average SNR (note that it is the pulse SNR and not the bit SNR in this case), and variance 2(SNR+2).

B1. Symbol Averaging and Preamble Length Computation

The required number of symbols is determined that should be used for each acquisition trial, in order to make sure the acquisition error (false alarm or missed detection) is small enough compared to the BER in data detection mode. As this approach assumes the noise level in the system is perfectly known, the effect of noise level estimation can be added and the corresponding required accuracy can be computed.

First consider BPSK, with code despreading according to (5) and further scaling by a factor $\sqrt{N_c}$. Phase knowledge is assumed for coherent detection, unlike the analysis done above based on non-central Chi-squared variables, and included later on the non-coherence penalty. The expected detected value is 0 for noise only, $\sqrt{SNR_b}$ for the expected signal with the right code phase, and $-\sqrt{SNR_b}/N_c$ for misaligned spreading code phases assuming a PN m-sequence. The standard deviation of the noise around these averages is 1. This also leads to the threshold on signal acquisition, as middle point between signal value $\sqrt{SNR_b}$ and closest false alarm which is 0 in the noise-only case. Hence, the threshold is computed as $\sqrt{SNR_b}/2$, provided the noise and signal power are known. This means that compared to bit detection, the acquisition process starts with a 6-dB loss as the separation between signal and noise is reduced by a factor 2 compared to the separation between positive and negative bits.

Moreover, as the carrier phase is not known yet, I and Q are non-coherently recombined towards the maximum amplitude. For orthogonal detection, such as this distinction between signal presence and noise only, the loss is close to 1 dB compared to coherent orthogonal detection. Considering this loss on top of the 6 dB mentioned above, using a reasonable $N_b=10$ bits per decision is proposed in the acquisition process, gaining 10 dB as they are coherently recombined, which leads to a final gain of 3 dB in signal-to-noise after subtracting the 7-dB loss. This is enough for making sure that the risk of error during synchronization is negligible compared to the system BER. Reducing the margin to 1.5 dB, we could use $N_b=7$ only.

For PPM, the situation is actually slightly better. As soon as demodulation is started, a binary decision variable is created as the difference between energy at both positions without need for phase information hence acquisition can be completely coherent. Hence, there is no 1-dB non-coherent recombination loss.

Based on this study, the overall preamble is rather small: considering $N_b=10$ in the search phase, this limits it to 500 bits (2 times 25 positions times 10 bit per position). A design with less margin ($N_b=7$) would limit it to 350 bits. These sizes do not include the part related to end-of-preamble detection.

B2. Number of Pulses Used by the Noise Energy Estimator

The thresholds previously defined were considering a perfect knowledge of signal and noise amplitude at the receiver. As a matter of fact, the signal-to-noise ratio can be considered known in the worst case: the minimal signal-to-noise ratio at which the system is considered working can be used as spec, and any higher value will improve the performance. However, the average noise level in the system still needs to be estimated, in order to define the detection threshold with respect to it.

With perfect noise estimation and normalization to 1, when the decision takes place with a design $SNR_b=N_c SNR$, the noise-related variance around it is 1. On the other hand, with $N_n$ samples for noise estimation we have a noise estimator of standard deviation $1/\sqrt{N_n}$ around its expected value 1. As this noise estimation amplitude is used to derive the detection threshold by multiplication, this translates in an uncertainty on the threshold equal to a standard deviation of $\frac{1}{2}\sqrt{SNR_b/N_n}$ on that value.

From the previous subsection, the standard deviation due to Gaussian noise and assuming a perfect threshold definition is equal to 1. Therefore it should be certain that the noise estimation error does not increase the total variance on the decisions by more than a factor 1.25, which is less than 1 dB loss, in order to keep satisfactory performance. This translates to the following requirement:

$$\left(\frac{1}{2}\sqrt{\frac{SNR}{N_n}}\right)^2 \leq .25 \quad (6)$$

with the squaring to move from standard deviation to variance. This easily leads to a constraint on the minimal number of samples to average in order to estimate the noise:

$$N_n \geq SNR_b = N_c SNR \quad (7)$$

Hence, if the number of noise averaging samples is counted in bits, i.e., sets of $N_c$ samples, a required number is found equal to the pulse-level signal-to-noise ratio, which is very small (possibly less than one), or stated in pulses, we find a number equal to the working $SNR_b$ value.

C. End-of-Preamble Detection

After acquisition, the receiver demodulates the remaining symbols of the preamble (typically all ones), up to the end of it where it reaches an EOP marker. The EOP marker is a special sequence with good autocorrelation properties as well as low cross-correlation with the previous part of the preamble in order to avoid false detections. A special threshold tells whether the EOP is detected or not. By the time of EOP detection, the system is fully synchronized and working in detection mode. Hence, +1 or −1 bits are received with Gaussian noise at a signal-to-noise ratio $SNR_b$ on top of them. For EOP detection, it is assumed that soft information is kept for these bits.

When the EOP PN sequence of length L, is correlated with the incoming bits, at the position of alignment there is an expected value of +L, and a noise increased by $\sqrt{L}$ compared to a single sample. At other positions, the expected values depend on the EOP code and the previous part of the preamble that will correlate with it. Considering that the preamble before the PN sequence is made of identical bits, either all ones or all zeros, Table 2 summarizes the EOP detection.

The table shows, depending on the order of the PN sequence (order n means $2^n-1$ elements), the maximal correlation obtained just before the EOP sequence with all +1 or all −1 preceding the sequence, in the second or third column, respectively. Based on the worst case of these two, the EOP aligned correlation (4th column), and the noise expansion (square root of the code length), the gain is detected in EOP detection SNR compared to bit detection. This shows that a sequence of length 31 (order 5) should be used to have enough gain for the EOP detection (7.4 dB in this case). A second value of gain is proposed, assuming that the polarity of the preamble bits can be selected before EOP sequence to +1, leading to the best separation. In that case, a shorter sequence (length 15) is enough. This case is kept as the most realistic situation: the EOP sequence can be designed knowing what is present before in the preamble.

TABLE 2

Detection gain provided by various EOP sequences, compared to simple bit detection.

| Order | Max (+1) | Max (−1) | Max (PN) | Gain (dB) | Gain (+1) |
|---|---|---|---|---|---|
| 2 | −1 | 1 | 3 | −4.8 | (1.2) |
| 3 | −1 | 3 | 7 | −2.4 | (3.6) |
| 4 | −1 | 5 | 15 | 2.2 | (6.3) |
| 5 | 3 | 5 | 31 | 7.4 | (8.0) |
| 6 | −1 | 13 | 63 | 10.0 | (12.1) |
| 7 | −1 | 19 | 127 | 13.6 | (15.2) |
| 8 | 7 | 27 | 255 | 17.1 | (17.8) |

Before looking for the EOP sequence, the system estimates the signal power as reference, in order to derive the corresponding threshold and predict the EOP correlator output when the signal is aligned or not. This is done because the actual signal level could be different from the design $SNR_b$. This is achieved using the same number of bits as the EOP sequence. As both effects are additive on the final estimator, there remains in the end a 4-dB immunity out of the 7 dB of the code, comparable to the immunity selected when recovering spreading code phase.

D. Simulations of Performance

Figure 5:
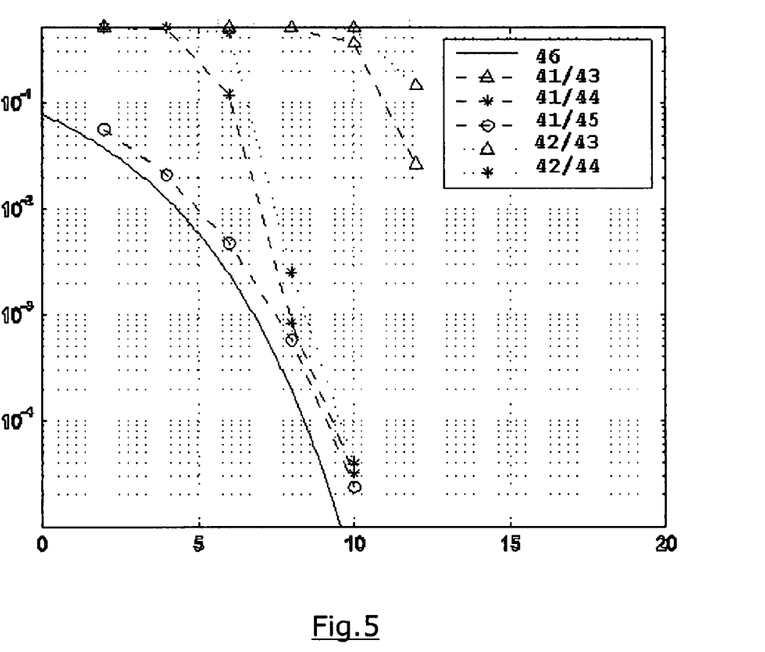
FIG. 5 shows BPSK BER versus $E_b/N_0$ with 7 and 31 pulses per bit and 2, 6, or 20 bits per position for the searching step ($N_b$ parameter). The theoretical curve assumes ideal synchronization, whatever the number of pulses per bit.
Figure 6:
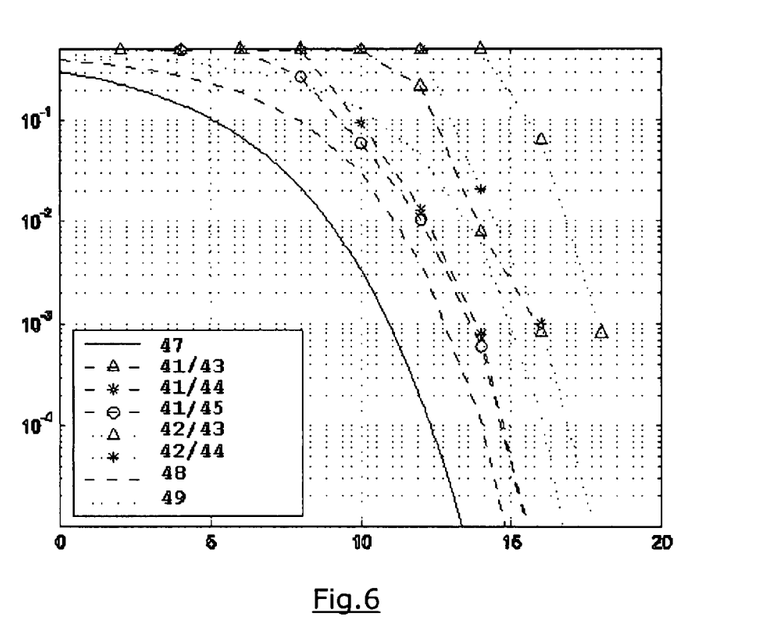
FIG. 6 shows PPM BER versus $E_b/N_0$ with 7 and 31 ppb and $N_b=2$, 6, or 20. The continuous theoretical curve assumes a single-pulse-per-bit mode, the other curves also integrate the non-coherent recombination loss of PPM.

In order to validate the acquisition approach, an analytical approach of previous sections is illustrated based on simulations. FIGS. 5 and 6 present the corresponding system performance for BPSK and PPM, respectively.

FIG. 5 shows the BER versus $E_b/N_0$ with 7 (41) and 31 (42) pulses per bit and 2 (43), 6 (44) or 20 (45) bits per position for the searching step ($N_b$ parameter). For BPSK, using 6 or 20 bits per search gives a performance within 1.5 dB of the theoretical curve (46) (ideal synchronization), in the zone of interest (BER $10^{-3}$ to $10^{-5}$). The 20-bit synchronization only has an advantage at lower values of $E_b/N_0$, but that zone is of limited practical use. This matches the recommendations of the theoretical study, recommending $N_b$=7 to 10. 2-bit synchronization yields an additional 5-dB loss, which is not acceptable.

For PPM, the imperfect non-coherent recombination of multiple-pulse-per-bit systems needs to be considered. Therefore, different theoretical curves are shown as function of $N_c$ in FIG. 6. FIG. 6 shows the BER versus $E_b/N_0$ with 7 (41) and 31 (42) pulses per bit and 2 (43), 6 (44) or 20 (45) bits per position for the searching step ($N_b$ parameter). The continuous theoretical curve (47) assumes a single-pulse-per-bit mode, the other curves also integrate the non-coherent recombination loss of PPM. The dashed theoretical curve (48) assumes a 7 pulse per bit mode and the dotted theoretical curve (49) assumes a 31 pulse per bit mode. However, similar conclusions hold, except that the various trends are a bit less pronounced. This confirms that single-step synchronization is an efficient proposal for low-power systems, especially in order to limit the transmitter power consumption via a short preamble length.

These two figures only consider AWGN channels, while non line-of-sight UWB scenarios show strong fading and multipath effects. With this respect, it should be noted that this does not impact the fundamental behavior of our algorithm. With a low-complexity one-tap analogue receiver, the best option is to find the maximal-energy position in the channel response, by exhaustive search. In this case the pulse SNR is based on the energy received around the position of the largest channel tap. The energy spread elsewhere cannot be recovered without RAKE type of recombination.

Figure 7:
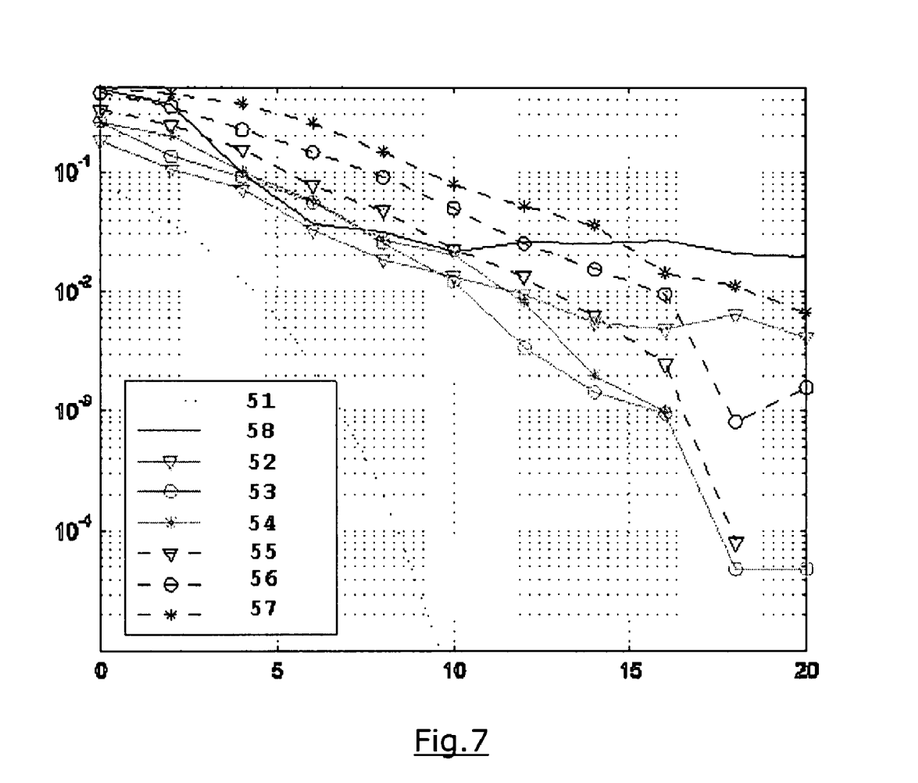
FIG. 7 shows system BER versus $E_b/N_0$ on a fading channel as can be found around the body, using $N_b=6$ only and BPSK modulation.

In order to evaluate the effect of multipath channels on the algorithm, a channel model matching a target scenario (namely ultra-low-power body area networks [4]) of this study has to be considered. It contains both multipath effects and lognormal fading, but the channel delay spread is shorter than the pulse frame (no inter-pulse interference). FIG. 7 shows that the system performance of the original algorithm (58) drops and shows an error floor around $10^{-2}$ BER due to fading effects. Basically, as soon as the signal amplitude is reduced by more than a factor 2 due to fading, it falls below the detection threshold, whatever the signal-to-noise ratio.

A solution is to compute the threshold based on a value of the $E_b/N_0$ which is not the one actually occurring on the channel, but an optimized so-called "design signal-to-noise" parameter. As can be seen on FIG. 7, we can completely remove the error floor by taking a value from 6 (52) to 8 dB (53) for this parameter. This means that whatever the actual value of $E_b/N_0$, the detection threshold is computed as if $E_b/N_0$ was only 6 or 8 dB, leaving more margin for fading. Although this technique enables the removal of the error floor phenomenon, it cannot avoid a significant loss with respect to the ideal AWGN curve (10 dB at $10^{-4}$ to $10^{-5}$), a behavior typical for fading channels. Other curves are plotted for 9 dB (54), 10 dB (55), 12 dB (56) and 14 dB (57). The adaptive curve (58) considers the expected actual signal-to-noise-ratio in the threshold computation.

E. Digital Word-Serial Implementation

Figure 8:
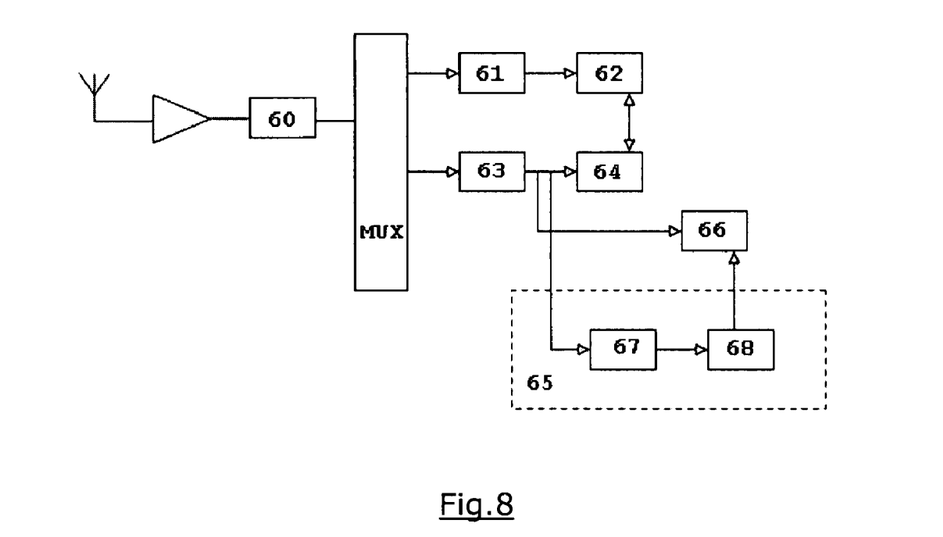
FIG. 8 shows the architecture of the digital receiver baseband.

In order to support the synchronization solution described herein, the proposed digital baseband architecture is illustrated by FIG. 8. The incoming signal is being pre-processed (60) as mentioned before. The pre-processing block (60) adapts the incoming data in function of the modulation (BPSK or PPM) and the current operation (synchronization, data detection . . . ), so that the next blocks can run on the correct input. Before searching for the signal, the threshold-based acquisition scheme computes the required threshold distinguishing signal from noise. Therefore noise is being accumulated by a noise accumulator (61), which also averages the noise level. From these results, (62) derives the acquisition threshold. The sliding correlator (SC) (63) is responsible for testing all the positions and code phases, while the code accumulator (CA) (64) is responsible for averaging $N_b$ bits before taking the decision. The module further comprises another sub-module: EOP detection (66).

Operating Modes of the Receiver

Figure 9:
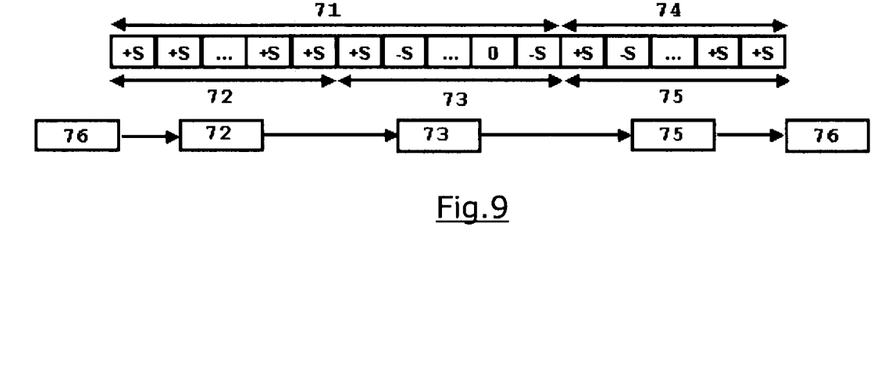
FIG. 9 shows the operating modes of the transmitter.

The receiver operation is based on the presence of a fixed synchronization preamble (71) at the beginning of a burst. FIG. 9 sketches the operating modes of the transmitter. This preamble (71) comprises a head sequence (72) and a EOP sequence (73). First, a header made of repeated symbols with all the same sign is transmitted. Each symbol S is spread or multiplied by a ternary code, i.e., having values +1, −1 and 0 for its pulses. After the header, the EOP sequence is added, and also based on a ternary code but at symbol level, i.e., +S, −S and no symbol transmitted. After the preamble (71), the payload (74) comprising the data sequence (75), is sent. Before and after the burst, the transmitter remains in standby mode (76).

Figure 10:
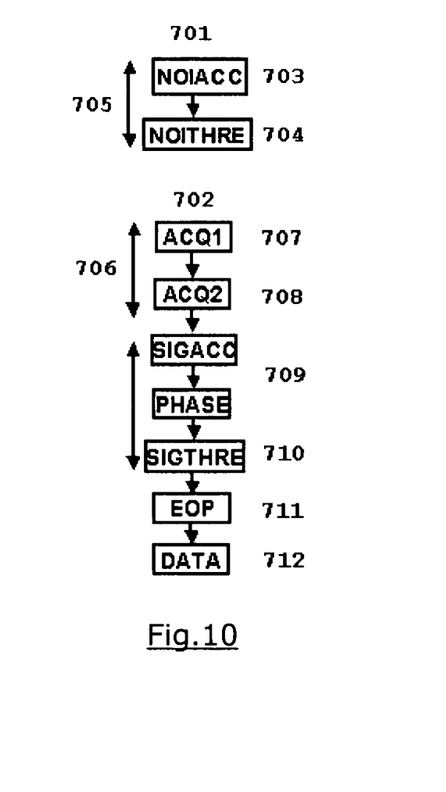
FIG. 10 shows the operating modes of the receiver.

FIG. 10 represents schematically the operating modes of the UWB receiver. There are two groups of operating modes. The first group (701) operates after wake-up and during the silent time slots. After wake-up the receiver sets the frequency of the PLL. At this stage it is assumed that the transmit and receive clocks are sufficiently equal to each other, such that the phase drift due to the frequency mismatch is small enough to guarantee a reliable correlation energy over the duration of a spreading code sequence. Small errors in this frequency setting are corrected after the acquisition phase i.e. the tracking phase of the burst. After the wake-up and during some moments when the channel is silent, the receiver accumulates noise (operation mode NOIACC (703)) and computes the noise threshold based on noise level measurements (operation mode NOITHRE (704)). This phase is called the noise threshold computation (705). The threshold is used for pulse- and bit-level synchronization. This silent duration of the channel is typically determined by the MAC.

The second group of operating modes are executed at each burst (702). The reception starts by the acquisition mode (706). In this mode (operation mode ACQ1 (707)) the correlator is utilized in a cyclic fashion to compute the correlations for every possible alignment of the spreading code and scanning successive delay positions. Each correlation result from this computation is compared to the computed threshold in order to declare it as potential signal found. After this first alarm, the receiver searches for the maximum of the cyclic correlations for each possible delay offset of the received pulse in the frame (operation mode ACQ2 (708)). If no result above the threshold is found through all cycles, then the system goes back to search for the first alarm.

Figure 11:
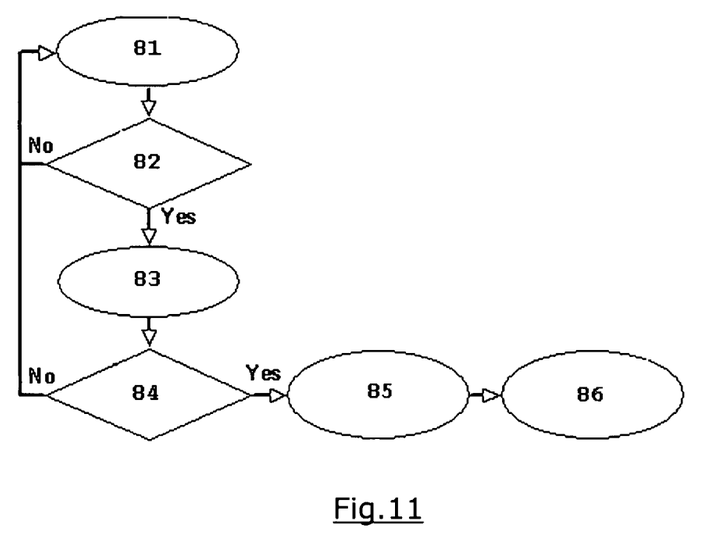
FIG. 11 shows the state-machine for the threshold comparison.

The sequence of the acquisition events is shown in FIG. 11. Shift one position (81) and check if the signal is above the computed threshold (82). If this is not the case then start again (81). If it is above the threshold, loop all $N_p$ positions (83). For this design, $N_p$ equals 25 (25 ns frame duration divided by 1 ns resolution). FIG. 3 already illustrated the possible positions. Then check if any one of the positions is above the threshold (84). If this is not the case then start again (81). Otherwise, keep this maximum as the synchronized position (85) and proceed with the signal estimation and EOP detection (86).

Since for PPM the correlation is performed on the difference of energies of two different PPM locations, only one correlator is needed. On the other hand, for BPSK, two correlators are needed (one for the I-branch and the other for the Q-branch) since the carrier phase φ of the received BPSK pulse with respect to the I branch is unknown. For BPSK this requires an additional step (65), the estimation of the carrier rotation phase φ. The rotation phase is estimated by using the correlation results of the I and Q branches (67). This is done by a Coordination-Rotation-Digital-Computer (CORDIC) (68) (e.g. by computing first the φ=a tan(Q/I) value and then the phasors Cos(φ) and Sin(φ)). An iterative CORDIC that operates at the pulse repetition rate is used in order to reduce the hardware complexity in terms of number of gates [2]. Afterwards, the I and Q branches are combined at the input in order to form the decision variable. After this, Q-path correlator is disabled.

Following the acquisition mode, the EOP-threshold computation starts (709) and the carrier phase offset is compensated (710). In this mode the EOP threshold is computed considering the average correlation energy, the length of EOP sequence, and the SNR of the channel.

The final step is the detection of the EOP sequence, marking the end of the header and enabling the system to go to the data detection state (712), which informs the start of the incoming data in the burst. The EOP detection (711) is done on the following steps: (1) correlate the decision variable with the codeword, (2) correlate the correlation results of the first step to the EOP sequence, (3) compare the correlation results of the second step to the EOP threshold computed earlier. The reception ends when the number of received bits becomes the predefined burst length.

Synchronization Module for Timing and Code-Phase Offset Compensation

Figure 12:
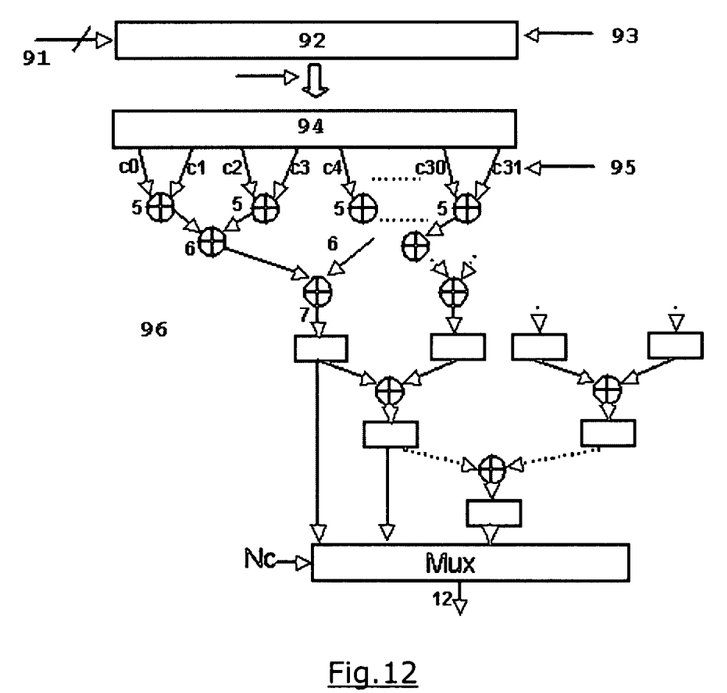
FIG. 12 shows the sliding correlator.
Figure 13:
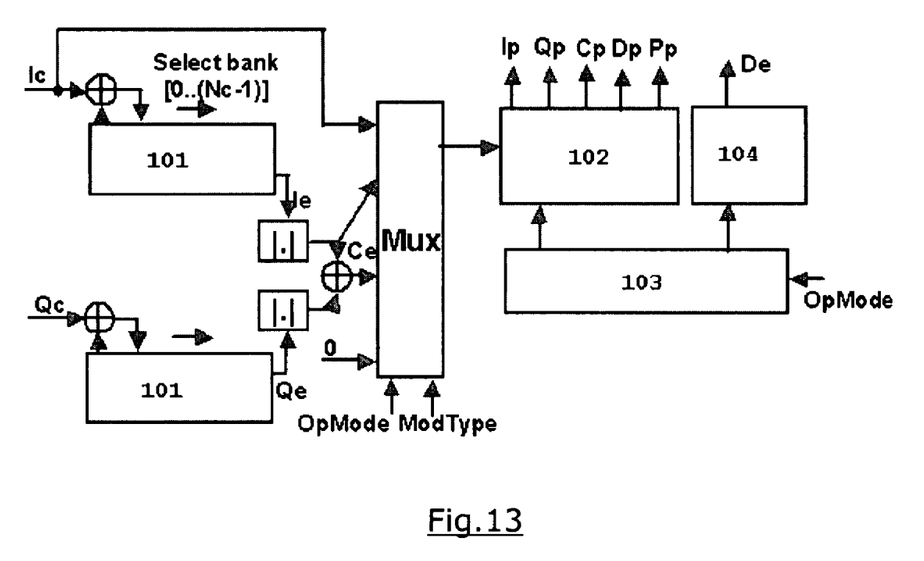
FIG. 13 shows the code accumulator.

Synchronization module in the receiver consists of two sub-modules: (1) sliding correlator (SC) (FIG. 12) and (2) code accumulator (CA) (FIG. 13). The incoming 5-bit decision variable (91) is serially shifted through the serial-to-parallel converter (92) until the position defined at the codeword length ($N_c$, for example 1-32) (93) and then loaded in parallel to a correlator buffer (94) at every $N_c$ pulse cycles. During acquisition, each tap of the correlator buffer is multiplied with each chip of the codeword (95). The results of the multiplication are then summed through a balanced binary adder tree (96) that has been pipelined for every eight taps. Here, we have chosen eight in order to increase the maximum operating frequency while keeping a reasonable overhead in the number of flip-flops. The throughput for the pipelined correlator is one, i.e., one new correlator value output for each clock cycle and new incoming data decision variable. Since the lengths of code rotation/multiplication and shift/load operations scale with the codeword length, the dynamic power consumption of SC linearly scales with the codeword length. Once the acquisition is completed, the incoming code is aligned with the codeword. Therefore, the correlation is computed at every $N_c$ pulse cycles without a need for a cyclic rotation of the codeword.

During the acquisition mode, the correlation results from the sliding correlator are accumulated $N_b$ times in the correlator accumulators (101) for each code phase inside the CA module. These results are shifted or cleaned after every $N_b \times N_c$ cycles. This code repetition is used in order to increase the SNR of the received signal. At the $N_b$-th accumulation, the results of accumulation are shifted one-by-one to the max detector (102) to store the code-phase that has the maximum energy ($I_p$, $Q_p$, $C_p$ are being stored and also the configuration of the delay line $D_p$ and the code phase of the correlator $P_p$). The max detector is being controlled by a control block (103), which also controls a delay counter (104) giving the delay line $D_e$. During this shift, the corresponding tap of accumulator is loaded with the new incoming correlation result. By the above-mentioned word-serial architecture, the synchronization modules operate at the maximum throughput without a need for a local storage. Also there is no need to increase the preamble size as the code phase and the timing offset are compensated at $2 \times N_b \times N_c$ pulse cycles per each delay step. Here factor 2 comes from two-times scanning the delay-line to avoid false first-alarms described earlier in section A. During acquisition the delay line is configured at coarse steps of 1 ns up to 255 ns. A delay step of 1 ns leads to an error of maximum 0.5 ns from the peak correlation, translating into a loss of 0.5 dB [3]. This leads to 25 coarse delay steps. For an AWGN channel with $E_b/N_o=10$ dB, we typically have $N_b=6$ and $N_c=31$ in order to have a bit-error-rate (BER) of $2 \times 10^{-5}$.

EOP Detection Module

After acquisition, the receiver demodulates the remaining symbols of the preamble (typically all ones), up to the end of it where it reaches an EOP marker. Simulations show that selecting a PN-sequence of length 15 can reduce the risk of missing the EOP to a negligible value. For the EOP-detection module a correlator is used that has a similar architecture as the sliding correlator, however with a word length of 8-bit at each tap. Before looking for the EOP sequence, the system estimates the signal power as reference, in order to derive the corresponding threshold and predict the EOP correlator output when the signal is aligned or not. This is achieved using the CORDIC output that computes the code magnitude that uses the same number of codes as the EOP sequence.

APPENDIX

In this appendix two acquisition algorithms suited to the low-power receiver architecture are compared. Both algorithms minimize the preamble length for reduced transmitter power consumption while keeping good acquisition performance: either scanning pulse position and code phase either successively (two-step) or simultaneously (single-step, the solution that is preferred).

The two-step acquisition technique starts by detecting the pulse position in the frame: the receiver searches for pulses by sampling the received signal with a clock whose phase can be varied in a number of delay steps covering the whole frame duration (FIG. 3). When the detected signal energy exceeds a threshold, a new scanning pass tests once again each possible position, to make sure that the final position has the highest energy, which translates into maximal communication distance.

When pulses have been localized in the frames, the second step is to split bits from each other, as $N_c$ pulses per bit are used with a spreading code. This code phase synchronization is achieved by trying out the $N_c$ possible code phases, using a sliding window correlator, accumulating several successive bits to get enough SNR. This step is achieved by coherent despreading. For PPM, the result of the differential energy detector over both positions is kept as bipolar soft information to be accumulated over pulses. For BPSK both I and Q are coherently combined as the carrier phase is still missing; after taking the maximum amplitude, the phase of this maximum is used as estimate for I/Q recombination of data bits.

Typically $N_c=30$, which is the number of code phases to test. Hence, the search space size for the two-step approach is 25 positions for the pulse (25-ns frames with 1-ns steps), followed by 30 phases for the code, in total 55 values to compute and compare to synchronization thresholds. However, each of these steps may require many samples to be accumulated.

The two-step search has the advantage of a small search space, but its performance suffers from the non-optimality of the non-coherent recombination in step one. An alternative is to combine both steps in order to directly have a coherent code despreading at each position and with each spreading code phase, based on a parallel implementation of the correlation. This is the solution used herein, searching simultaneously for pulse position and spreading code phase.

The search space size increases to the product of pulse positions by code length, in our case to 750 (30×25), but the signal-to-noise ratio is higher thanks to coherent recombination, meaning that we can detect the signal from less pulses. It also supports CDMA differentiation of users, as codes are used from the beginning.

Required Pulses for Pulse Position Acquisition in Two-Step Case

Each signal pulse sample comes on top of Gaussian noise with signal-to-noise ratio SNR on the I/Q branch aligned with the signal, most likely to be small as many pulses per bit are required for successful communication. Normalizing noise energy to 1, this leads to an average energy of the signal plus noise equal to (1+SNR), leading to a symmetrical decision threshold (1+SNR/2) in order to detect a single pulse. Statistics give for each such noise sample a variance 1, and for signal plus noise a variance (1+2SNR) [9]. I and Q energies are combined due to the non-coherent character, with in case of signal presence and after division by 2 an average energy (1+SNR/2) and variance (1+SNR)/2 around it, as described before, but without division by 2 (4 on the variance) there. This variance is reduced through averaging in order to enable a reliable decision, by taking $N_b$ bits or $N=N_b N_c$ pulses. The corresponding standard deviations become $\sigma_n = 1/\sqrt{N}$ for noise only and $\sigma_s = \sqrt{(1+SNR)/2N}$ for signal samples, and a Gaussian assumption considering the central limit theorem.

The risk of missing a burst depends on the ratio of this standard deviation to the decision distance SNR/4 between the signal energy (1+SNR/2) and the threshold at (1+SNR/4). This ratio is used to compute an equivalent AWGN ($E_b/N_0$) and its corresponding BER, making the analogy with a BPSK detection from signals +1 or −1 and one-dimensional noise of variance $1/(2E_b/N_0)$. In our case, the corresponding $(E_b/N_0)_{synch}$ is given by (8). This is obtained from the equivalence, using the one-dimensional noise standard deviation when the signal is normalized to unit energy, and scaled by the squared distance to the threshold which gives $(SNR/4)^2$:

$$\left(\frac{E_b}{N_0}\right)_{synch,BPSK} = \frac{N \cdot SNR^2}{16(1 + SNR)} \qquad (8)$$

For PPM, as two positions are averaged over each frame, the average in the presence of signal is only (1+SNR/4), hence the threshold is (1+SNR/8). However, the noise standard deviation is reduced by $\sqrt{2}$ due to averaging over two samples per frame, leaving finally the following equivalent $(E_b/N_0)_{synch}$:

$$\left(\frac{E_b}{N_0}\right)_{synch,PPM} = \frac{N \cdot SNR^2}{32(1 + SNR/2)} \quad (9)$$

We can rewrite (8) and (9) as function of $SNR_b$, which is a known design parameter. For BPSK, we have a linear gain, meaning that $SNR_b = N_c SNR$ thanks to coherent combination. For PPM with non-coherent reception, the gain is smaller. It comes from the fact that each noisy pulse is converted into an energy value (squaring operation), before taking the difference between both pulse positions and finally accumulating these energy differences. To our knowledge, there is no closed-form expression for the resulting equivalent signal-to-noise. However, the corresponding gain was found to be close to ⅔ of the coherent gain on a log scale (this is illustrated by theoretical curves of FIG. 6), hence we use $SNR_b = N_c^{2/3} SNR$. We assume that the required $SNR_b$ varies between 5 and 10 dB for BPSK, and between 8 and 13 for PPM to take into account its intrinsic 3-dB loss as orthogonal modulation. This gives the requirements on N, split in code length $N_c$ and number of bits $N_b$. For BPSK, the number of bits required increases with the desired $SNR_b$ as well as the number of pulses per bit (Table 3).

TABLE 3

Number of bits required for testing each position in BPSK, as a function of pulse SNR, bit $SNR_b$ (5 or 10 dB), and synchronization error rate SER ($6.10^{-3}$ or $4.10^{-6}$ coming from BPSK detection model with $E_b/N_0 = 5$ or 10 dB in (8)).

| $SNR_b$ | SNR | | | |
|---|---|---|---|---|
| @ SER | 5 dB | −5 dB | −15 dB | −25 dB |
| 5 dB | $N_c = 1$ | $N_c = 10$ | $N_c = 100$ | $N_c = 1000$ |
| $6.10^{-3}$ | 22 | 79 | 648 | 6341 |
| $4.10^{-6}$ | 71 | 251 | 2051 | 20051 |
| 10 dB | $N_c = 3$ | $N_c = 32$ | $N_c = 320$ | $N_c = 3200$ |
| $6.10^{-3}$ | 7 | 25 | 205 | 2005 |
| $4.10^{-6}$ | 22 | 79 | 648 | 6341 |

As the accumulation of $N_c$ pulses per bit for detection is less efficient for PPM (factor ⅔), the preamble overhead looks smaller in terms of equivalent bits (Table 4), but to be multiplied by the larger number of pulses per bit needed to enable detection.

TABLE 4

Number of bits required for testing each position in PPM (see Table 3), with $SNR_b$ of 8 or 13 dB.

| $SNR_b$ | SNR | | | |
|---|---|---|---|---|
| @ SER | 5 dB | −5 dB | −15 dB | −25 dB |
| 8 dB | $N_c = 3$ | $N_c = 90$ | $N_c = 2800$ | 90000 |
| $6.10^{-3}$ | 10 | 16 | 45 | 142 |
| $4.10^{-6}$ | 32 | 51 | 144 | 449 |

TABLE 4-continued

Number of bits required for testing each position in PPM (see Table 3), with $SNR_b$ of 8 or 13 dB.

| $SNR_b$ | SNR | | | |
|---|---|---|---|---|
| @ SER | 5 dB | −5 dB | −15 dB | −25 dB |
| 13 dB | $N_c = 16$ | $N_c = 500$ | $N_c = 16000$ | 500000 |
| $6.10^{-3}$ | 2 | 3 | 8 | 25 |
| $4.10^{-6}$ | 6 | 9 | 26 | 80 |

These conclusions are very negative for practical multiple-pulse-per-bit cases, as these numbers still have to be multiplied by the number of positions to be tested, in our case 25, and again by 2 as 2 search passes are required. For BPSK at 100 ppb, the preamble would last 32 kbit (50×648). For PPM, we would anyhow need too many pulses per bit to achieve efficient communication in this SNR range (almost 3000 with SNR=−15 dB), which is not realistic. Practically, this limits UWB with two-step acquisition to a pulse SNR of −5 to 5 dB, but not less than that. Compared to that, the number of pulses required for the second step concerning spreading code phase acquisition can be shown to be negligible, hence it is not detailed here.

Required Pulses for Pulse Position Acquisition in the One-Step Case

For the described two-step synchronization solution, the total preamble length was shown in the previous Sections to reach into kilobits of length, which requires a large power consumption and channel occupation from the transmitter. This mainly comes from the difficult non-coherent energy accumulation, quantified in Tables 3 and 4.

The more preferable solution, described herein, involves merging pulse position and spreading code phase acquisition. The corresponding computations have been fulfilled before, to come with a required $N_b = 7$ to 10. This is preferable to the results shown in tables 3 and 4, which were asking many more bits simply for getting the same performance for acquisition as for. Moreover, it does not depend on the number of pulses per bit in this case.

Based on this study, the overall preamble is much smaller than for 2-step synchronization: considering $N_b = 7$ in the search phase, this limits it to 350 bits (2 times 25 positions times 7 bit per position), independently of the number of pulses per bit, compared to the kilobits of 2-step synchronization. Consequently, the single-step solution is preferable, especially for systems focusing on low-power transmitters. Moreover, receiver complexity is not increased. Each position is tested with any possible spreading code phase, which gives a number of operations quadratic in $N_c$, instead of linear for the two-step case. However, there are fewer samples to process. As an example, taking $N_c = 100$ ppb, one needs 100 times more computations on each position, but each position requires only 7 bits, while 648 are used in 2-step mode (Table 3), making both approaches of similar complexity.

All the following references are incorporated herein by reference in their entirety.

[1] M. Verhelst, W. Vereecken, M. Steyaert, and W. Dehaene. Architectures for low power ultra-wideband radio receivers in the 3.1-5 GHz band for data rates <10 Mbps. In *ISLPED '04, International Symposium on Low Power Electronics and Design*, pages 280-285, August 2004.

[2] R. Blaquez, P. P. Newaskar, F. S. Lee, and A. P. Chandrakasan. A baseband processor for impulse ultra-wideband communications. *IEEE Journal on Solid-State Circuits*, 40(9): 1821-1828, September 2005.

[9] John G. Proakis. *Digital communications*, third ed. McGraw-Hill, 1995.

[3] S. Vijayakumaran and T. F. Wong. A search strategy for ultra-wideband signal acquisition. *IEEE Transactions on Communications,* 53(12):2015-2019, December 2005.

[4] Andrew Fort, Claude Desset, Julien Ryckaert, Philippe De Doncker, Leo Van Biesen, and Piet Wambacq. Characterization of the ultra wideband body area propagation channel. In ICU, Zurich, Switzerland, September 2005.

The invention claimed is:

1. A method for determining an actual pulse position in a signal, said signal comprising a plurality of successive frames, wherein each frame has length (L) and contains one pulse with width (W), a number of discrete possible pulse positions being considered within each frame which is at least L/W, the method comprising the steps of:
   a) sampling said signal at a sampling rate below L/W with a varying sampling phase such that the whole frame length L is covered,
   b) obtaining a set of samples with at least one at each of the possible pulse positions,
   c) correlating said set of samples with a set of one or more predetermined values forming a code which is contained as a repeated symbol in a fixed number of said successive frames,
   d) determining said actual pulse position from said correlation, and
   e) determining a code phase from said correlation, said code phase being an offset between said repeated symbol and said code,
   wherein step c) comprises converting said set of samples from serial data to parallel data by means of a serial-to-parallel converter and correlating said parallel data with rotated versions of said code in a correlator, thereby obtaining a set of correlation values, and
   wherein steps d) and e) are performed together by selecting a maximum among said set of correlation values, said maximum defining the actual pulse position and the code phase.

2. The method according to claim 1, wherein said sampling rate is equal to the pulse repetition frequency of said signal.

3. The method according to claim 1, wherein said method is performed in both an I-branch and a Q-branch of a receiver, and wherein said receiver uses binary phase-shift keying (BPSK).

4. The method according to claim 1, wherein said method is performed on a common branch of a receiver, and wherein said receiver uses pulse position modulation (PPM).

5. A method according to claim 1, further comprising:
   f) accumulating noise for computing a noise threshold; and
   g) comparing said computed correlations with said computed noise threshold.

6. A method for determining an actual pulse position in a signal, said signal comprising a plurality of successive frames, wherein each frame has length (L) and contains one pulse with width (W), a number of discrete possible pulse positions being considered within each frame which is at least L/W, the method comprising the steps of:
   a) sampling said signal at a sampling rate below L/W with a varying sampling phase such that the whole frame length L is covered;
   b) obtaining a set of samples with at least one at each of the possible pulse positions;
   c) correlating said set of samples with a set of one or more predetermined values, wherein said set of predetermined values forms a code, and wherein a fixed number of said successive frames forms a repeated symbol containing said code;
   d) determining said actual pulse position from said correlation;
   e) determining a code phase from said correlation, said code phase being an offset between said repeated symbol and said code, wherein said pulse position and said code phase are determined together by correlating said set of samples with rotated versions of said set of predetermined values;
   f) accumulating noise for computing a noise threshold;
   g) comparing said computed correlations with said computed noise threshold;
   h) accumulating signal for computing an end of preamble threshold;
   i) correlating a decision variable representing processed signal with said code;
   j) comparing the correlation results to an end of preamble (EOP) threshold; and
   k) determining the EOP according to said comparison.

7. A device operative to determine an actual pulse position in a signal, said signal comprising a plurality of successive frames, wherein each frame has length (L) and contains one pulse with width (W), a number of discrete possible pulse positions being considered within each frame which is at least L/W, wherein the device is operative to perform the steps of a) sampling said signal at a sampling rate below L/W with a varying sampling phase such that the whole frame length L is covered; b) obtaining a set of samples with at least one at each of the possible pulse positions; c) correlating said set of samples with a set of one or more predetermined values, wherein said set of predetermined values forms a code, and wherein a fixed number of said successive frames forms a repeated symbol containing said code, d) determining said actual pulse position from said correlation, and e) determining a code phase from said correlation, said code phase being an offset between said repeated symbol and said code, wherein said pulse position and said code phase are determined together by correlating said set of samples with rotated versions of said set of predetermined values, and wherein the device comprises:
   a serial-to-parallel converter for converting said set of samples from serial data to parallel data,
   a correlator for correlating said set of samples with said set of predetermined values, thereby obtaining a set of correlation values,
   a selector for selecting a maximum among said set of correlation values, said maximum defining the actual pulse position.

8. The device of claim 7, wherein said correlator is a sliding correlator providing rotated versions of said set of predetermined values during said correlation and computing all the rotated correlations with a throughput of one per each clock cycle and incoming decision variable.

9. The device of claim 7, wherein said device is part of an impulse radio ultra-wideband IR-UWB) transceiver.

10. The method according to claim 6, wherein said sampling rate is equal to the pulse repetition frequency of said signal.

11. The method according to claim 6, wherein said method is performed in both an I-branch and a Q-branch of a receiver, and wherein said receiver uses binary phase-shift keying (BPSK).

12. The method according to claim 6, wherein said method is performed on a common branch of a receiver, and wherein said receiver uses pulse position modulation (PPM).

* * * * *